United States Patent [19]
Cala et al.

[11] Patent Number: 5,593,504
[45] Date of Patent: Jan. 14, 1997

[54] METHOD OF CLEANING SOLDER PASTES FROM A SUBSTRATE WITH AN AQUEOUS CLEANER

[75] Inventors: Francis R. Cala, Highalnd Park; Richard A. Reynolds, Plainsboro; Eric E. Eichhorn, Princeton, all of N.J.

[73] Assignee: Church & Dwight Co., Inc., Princeton, N.J.

[21] Appl. No.: 429,514

[22] Filed: Apr. 26, 1995

[51] Int. Cl.$^6$ .................. B08B 3/04; B08B 3/12
[52] U.S. Cl. .................. 134/1; 134/2; 134/40; 134/42; 510/175; 510/245; 510/254; 510/255; 510/420; 510/421
[58] Field of Search .................. 134/1, 2, 38, 40, 134/42; 252/174.22, 174.14, 174.24, 156, 108, 109; 75/715; 510/175, 254, 255, 245, 420, 421

[56] References Cited

U.S. PATENT DOCUMENTS

| | | | |
|---|---|---|---|
| Re. 35,017 | 8/1995 | Winston et al. | 134/40 |
| Re. 35,045 | 10/1995 | Winston et al. | 134/40 |
| Re. 35,115 | 12/1995 | Winston et al. | 134/42 |
| 5046415 | 9/1991 | Oates | 101/128.21 |
| 5,122,200 | 6/1992 | Davis et al. | 148/23 |
| 5,234,505 | 8/1993 | Winston et al. | 134/40 |
| 5,234,506 | 8/1993 | Winston et al. | 134/40 |
| 5,261,967 | 11/1993 | Winston et al. | 134/40 |
| 5,264,046 | 11/1993 | Winston et al. | 134/42 |
| 5,264,047 | 11/1993 | Winston et al. | 134/42 |
| 5,296,041 | 3/1994 | Vinci et al. | 134/40 |
| 5,320,756 | 6/1994 | Winston et al. | 210/667 |
| 5,328,522 | 7/1994 | Sowa et al. | 148/23 |
| 5,433,885 | 7/1995 | Winston et al. | 252/174.24 |

OTHER PUBLICATIONS

"Prospects of Solder Paste Application in the Ultra Fine Pitch Era", *Proceedings of the 1993 Surface Mount International Technical Program*, vol. I, Dr. M. Xiao et al, San Jose, CA, pp. 454–468.

"Critical Stencil Printing parameters for Fine Pitch Technology", *Proceedings of the 1993 Surface Mount International Technical Program*, vol. I, S. K. Buttars, San Jose, CA, pp. 157–166.

"Soldering in Electronics, Second Edition", *Electrochemical Publications Limited*, Wassink, R. J. Klein, Asahi House, Port Erin, Isle of Man, British Isles, (1989), p. 557.

"Ensuring High–Yield BGA Assembly", *Circuits Assembly*, vol. 6, No. 2, M. Ferguson, (Feb. 1995), pp. 54–58.

"High Pin Count PBGA Assembly: Solder Defect Failure Modes and Root Cause Analysis", *Proceedings of the 1994 Surface Mount International Technical Program*, S. Fauser et al, San Jose, CA, pp. 169–174.

"Cleaning Systems for Low–Flashpoint Solvents", *Proceedings of the 1994 Surface Mount International Technical Program*, vol. III, No. 3, B. Kanegsberg, (Mar. 1995), pp. 21–28.

"The Future of Solder Paste Printing for SMT Reflow Soldering", *Soldering & Surface Mount Technology*, No. 13, E. K. Lo et al, Feb. 1993, pp. 22–25.

"Metal Mask Stencils for Ultra Fine Pitch Printing", *Surface Mount International Conference & Exposition Proceedings of the Technical Program*, vol. I, M. D. Herbst, San Jose, CA, Aug. 29–Sep. 2, 1993, pp. 101–108.

*Primary Examiner*—Jill Warden
*Assistant Examiner*—Saeed Chaudhry
*Attorney, Agent, or Firm*—Irving Fishman

[57] ABSTRACT

Printing applicators such as metal stencils and screens used to apply solder paste to printed circuit boards are cleaned to remove accumulated solder paste therefrom by an aqueous alkaline salt cleaner. The aqueous cleaner of the present invention comprises alkaline salts such as alkali metal carbonates, a surfactant formulation which contains at least one nonionic surfactant, an alkali metal silicate corrosion inhibitor and stabilizers to maintain the components in aqueous solution. The cleaner of the present invention contains no VOCs and is an effective and safe replacement for alcohol solvents previously used to clean solder paste from screens and stencils.

25 Claims, No Drawings

5,593,504

METHOD OF CLEANING SOLDER PASTES FROM A SUBSTRATE WITH AN AQUEOUS CLEANER

FIELD OF THE INVENTION

The present invention relates to an aqueous-based cleaner effective for removing solder pastes from substrates. The cleaner of this invention comprises an aqueous alkaline salt solution which contains a unique surfactant formulation. The present invention is particularly concerned with a process for cleaning solder paste from printing applicators, e.g., stencils and screens which are used to print the solder paste on printed circuit boards.

BACKGROUND OF THE INVENTION

In the electronics industry, electrical components such as resistors, capacitors, inductors, transistors, integrated circuits, chip carriers and the like, are typically mounted on circuit boards in one of two ways. In one way, the electronic components or modules are designed to mount to the printed circuit boards (PCBs) by means of plated through-holes in which the metal leads of the modules are spaced apart and sized to fit into corresponding plated through-holes and extend a small distance beyond the undersurface of the PCB. An alternative to the through-hole technique for mounting electronic modules on PCBs is surface mount technology (SMT) wherein the leads of electronic modules are soldered to metal pads plated on the surface of a printed wiring board. In this technique, a solder paste is applied to the metal pads and subsequently the electronic components are precisely placed on the PCB such that the coplanar leads of the module contact corresponding pads on the circuit board which are coated with a layer of solder paste. The solder paste comprises a soft solder alloy typically in a powder form and dispersed in a liquid medium conventionally containing a fluxing composition, an organic solvent and a thickening agent which provides the desired viscous or paste-like consistency to the solder formulation. The solder paste typically has sufficient adhesive strength to hold the components in position until the solder is melted. After application of the solder paste and placement of the electronic components, the entire PCB assembly is heated in a reflow oven to melt the solder in the solder paste thereby forming solder joints which permanently affix and electrically connect the electronic modules to the PCB. The assembly is then washed to remove the flux residue and tested.

A widely used technique for depositing the solder paste on the pads of the PCBs is by printing. Printing of the solder paste is usually carried out by either a screening or stenciling method. Screen printing involves the use of a screen of fine wire netting with a pattern of open and masked regions. During the screen printing operation, a moving squeegee presses the paste through the mesh openings in the open pattern regions, whereby the required areas on the PCB surface are covered with a layer of paste. Screen printing is usually carried out with the screen in an off-contact position in which the downward force of the squeegee brings the screen locally in contact with the surface of the PCB while the paste is forced through openings onto the underlying PCB surface. When the screen moves back to the off-contact position, this paste remains on the substrate by the wetting and adhesion of the paste to the surface of the PCB and the screen release or snap-off. A stainless steel gauze is a typical screen material.

Stencil printing is an alternative method of solder paste application similar to screen printing, but a stencil is used instead of a screen. A stencil is a metal foil such as of brass, stainless steel or copper, provided with openings which unlike the mesh structure of the screen are fully open and do not obstruct solder paste flow. The holes in the foil are usually made by machining, chemical etching from one or both sides of the foil or by a laser cutting technique. Both on- and off-contact modes can be applied to stencil printing. In on-contact printing the stencil and the substrate remain in contact throughout the printing stroke, and are mechanically separated after completion of the squeegee stroke. This involves the raising of the substrate so that its entire surface is in contact with the underside of the stencil throughout the printing cycle and lowering the substrate at the end of the printing stroke. The on-contact printing is widely used by volume producers as the printing can be performed both in the outward stroke in the first piece and the backward stroke on the second without smearing.

Stenciling is preferable to screening if very small areas of the solder paste are to be deposited on the PCB. The use of SMT generally offers higher circuit densities inasmuch as the spacing between leads of SMT components (the lead "pitch") can be significantly reduced from that of equivalent through-hole devices. As present technology favors the use of ever higher circuit densities and finer lead pitch, stencil quality is rapidly taking on an increasingly important role in surface mount technology. Thus, the recent advent of fine and ultra fine pitch parts as well as the use of ball grid arrays (BGAs) has brought significant new demands on stencil printing. In BGAs the leads are underneath the module. The stencil application of solder paste for components with pitches of less than 20 mil is considerably more demanding than it is for components with a 40–50 mil pitch. While it has been shown that stencil printing for lead pitches as small as 12 mil is achievable, heavy reliance is placed on exacting printability. It has been estimated that approximately 70 percent of SMT solder defects are due to solder paste printing problems.

Paste volume and viscosity are critical factors in achieving the necessary solder paste printing quality for fine, ultra fine and BGA components. Insufficient solder placed on the PCBs results in opens or shorts and is a primary cause of defects due to stencil printing. On the other hand, too much solder paste inevitably results in bridging between leads and rigid solder joints which are less compliant and more prone to cracks due to PCB/module thermal coefficient of expansion differences. Around the critical edges of the closely spaced openings in a stencil, it is not unusual to find a gap of 0.002 inch or more between the underside of the stencil and the PCB substrate. The downward pressure created by the action of the squeegee on the stencil is not enough to locally deform the stencil into intimate contact with the substrate. Accordingly, hydraulic pressure on the solder paste causes some of the paste to be extruded sideways into the gap between the stencil and the substrate. This can occur at each squeegee stroke and as solder paste progressively builds up to deposit on the lower surface of the screen around each opening, the printed edge is extended into the separate spaces between the solder pads, i.e., bridging. The printed pattern is then no longer acceptable and printing must be halted while the stencil is cleaned. Frequent cleaning of stencils is a major obstacle to high speed automated printing.

Clean stencils, accordingly, are a key factor in delivering the proper amount of solder paste to the PCB substrate. If apertures are partially or fully obstructed with dried paste or foreign material, conditions are in place for a circuit failure and open, i.e., insufficient paste. The consequences of not delivering a sufficient amount of paste to a BGA land can be particularly troublesome since it is difficult to detect the absence of paste on a BGA land even when using a transmission X-ray as a diagnostic tool. Accordingly, regular cleaning of stencils is required to prevent smearing due to solder paste getting onto the underside of the stencils and to clear obstructed openings. The finer the pitch, the more critical it is to ensure that the underside of the stencils are devoid of paste residues.

A wider range of solder pastes must be removed in stencil cleaning than in PCB defluxing. No-clean paste and in some situations rosin-based paste can be left on the PCB after reflow. However, all pastes must be removed from the stencils to achieve accurate paste placement and avoid PCB defects. No-clean, unreflowed solder pastes have a general reputation of being difficult to remove from stencil surfaces. Overall, the removal of rosin type solder paste is easier than no-clean type paste and certainly not as easy as water soluble pastes. RMA rosin paste generally requires something more than water for removal from the stencil.

The cleaner that is most widely used to clean stencils, screens and even misprints on the PCBs is isopropyl alcohol. Unfortunately, there are both environmental and safety problems associated with the use of isopropyl alcohol as a cleaning agent. Isopropyl alcohol is a volatile organic compound (VOC) and a dangerous fire risk. In addition to VOC and flammability concerns, other organic solvent and semi-aqueous cleaning systems have high biological oxygen demand (BOD) and chemical oxygen demand (COD). Although present aqueous systems can be very effective, many have high pHs in addition to containing VOCs and have relatively high BODs and CODs. Further, many current stencil cleaning agents of all types emit unpleasant odors which can bring about worker discomfort, e.g., headaches.

Stencils are cleaned by a variety of methods. The typical approach has been hand wiping. However, health risks, modern speed and efficacy requirements, as well as risk of damage to thin stencils and small apertures, have moved assemblers to automated stencil cleaning equipment. This automated equipment may operate in one or more different modes including immersion, spray-in-air and ultrasonics. Regardless of the mode of cleaning operation, proper waste management is a high priority area for all operators because of the nature of the waste involved. Various methods have been and are presently used to minimize or treat both solder paste and cleaning media wastes. One zero discharge approach utilizes evaporation of excess water as a way to perform multiple wash/rinse cycles without any waste discharge. A spray-in-air wash in enclosed equipment is followed by spray-in-air rinses, each of a very short duration. All water goes into the same reservoir. The excess volume due to the rinse water undergoes a controlled evaporation process and a complete flush is thus delayed. The type of cleaning agent most compatible with this type of system would have zero VOCs.

Accordingly, there is an increasing need for stencil cleaners which are effective, safe for workers and safe for the environment.

It is thus a primary objective of the present invention to provide a cleaning composition which is effective to remove solder paste from printing applicators such as stencils, screens and the like as well as unreflowed solder paste from printed circuit boards and is safe to use and non-hazardous.

It is another objective of the present invention to provide a cleaner which can remove unreflowed solder pastes from surfaces which is safe for workers to use and handle as well as safe for the environment and which does not include VOCs.

It is a further objective of the present invention to provide a cleaner for removing unreflowed solder pastes which is compatible with automated cleaning equipment.

Still another objective of the present invention is to provide a safe and effective method of removing solder paste from surfaces such as stencils, screens, PCBs and the like.

These and other objects of the invention can be readily discerned from the description of the invention which is set forth below and in the appended claims.

SUMMARY OF THE INVENTION

The present invention is directed to an aqueous cleaning composition useful for removing solder paste from surfaces and which comprises alkaline salts and at least one surfactant. Preferably, the surfactant is provided as a formulation having a uniquely tailored surfactant profile which provides optimum cleaning over a wide temperature range. More particularly, the surfactant formulation contains at least three nonionic surfactants which have cloud points that are staggered to give optimum cleaning over a broadened temperature range. It is generally known that nonionic surfactants provide optimum cleaning performance at a temperature that is just below or approaching the cloud point of the surfactant. Normally, however, surfactants chosen for use in cleaning compositions are correlated for maximum performance at a particular temperature of use and not for consistently high performance over a temperature range. As circuit assemblies can be fabricated with a wide variety of solder pastes, and solder paste printing equipment can be cleaned with a variety of cleaning apparatus, cleaning compositions tailored to a particular use temperature may not be very effective, as the user often has to adjust the cleaning temperature to accommodate the various factors mentioned immediately above. The present invention optimizes the use of the relationship between surfactant cloud point and optimum cleaning performance by including in the formulation surfactants with staggered cloud points in order to be effective over a broader temperature range. This technique is particularly beneficial at reduced washing temperatures where there is normally a reduction in cleaning versus that obtained at higher target temperatures.

The cleaner of the present invention is preferably provided in the form of an aqueous concentrate which is further diluted with water for use. The aqueous concentrate contains at least three nonionic surfactants which have differing cloud points to be effective over a temperature range extending at least 20° F. The nonionic surfactants have cloud points which are staggered so as to be at least 5° F. different from each other.

The concentrate of the present invention is used upon dilution at a temperature range of from 90°–145° F. to clean solder pastes from printing applicators, such as stencils and screens and even to clean misprinted PCBs. The aqueous based cleaner of this invention is effective to clean the printing applicators to ensure accurate printing of the PCBs having fine and ultra fine lead pitches and BGAs. The cleaner of this invention contains no VOCs, and is at least as effective as isopropyl alcohol and is safer to use and safer to the environment than present organic solvent-containing cleaners.

The aqueous cleaning concentrate of this invention useful for removing solder pastes from printing applicators and circuit assemblies, also can include other adjuvants such as corrosion inhibitors to prevent corrosion of the metal stencils and screens, hydrotropes to maintain the surfactants in solution, defoaming agents as well as anionic surfactants which are useful over a wide temperature range.

DETAILED DESCRIPTION OF THE INVENTION

The cleaning composition of the present invention is capable of removing any type of solder paste from substrates contaminated with the same. Accordingly, there is no criticality as to the type of solder paste which can be removed by the cleaning composition of the present invention. Typically solder pastes as expressed above are formed from a solder alloy, fluxing agent, solvents and a thickening agent. The solders are typically comprised of at least two of the following metals; tin, lead, silver, bismuth, indium, antimony and cadmium. Tin-lead solder alloys are commonly used in concentration ranges from about 50 to 70 wt. % tin and about 30 to 50 wt. % lead. The solder alloy is provided in the form of a powder which is prepared by conventional means, e.g., melting and atomizing solder to form solder powder. Typically, the particle size of the solder alloy will be less than 150 microns. The specific flux ingredients which are used in the solder pastes are not critical for the effectiveness of the cleaner composition of the present invention. Any flux ingredients known to those skilled in the art can be removed by the cleaner of the present invention. Thus, water soluble fluxes such as organic acids including lactic, citric, oleic, stearic and gluconic acids; organic hypohalides such as aniline hypochloride, glutamic acid hypochloride, dimethyl ammonium chloride; amines such as urea and triethanolamine; and amides; and the like can be incorporated into the solder pastes and removed prior to reflow by the cleaner of this invention. Further, rosin-based fluxes can be included in the solder paste which can be cleaned by the cleaner of this invention including gum rosin, wood rosin, tall oil rosin, derivatives of rosin such as dimerize resin, saponified resin or rosin derived ester resin (also known as "ester gum"). Typically, such rosin fluxes include an activator such as an acid, e.g., an aliphatic acid, mineral acid, aromatic acid; or an amine, e.g., an aliphatic amine or a halide salt of an amine; and a solvent such as an alcohol, glycol, ester, ketone, aromatic solvent and the like. No-clean fluxes can also be removed by the cleaner of the present invention. The solder pastes typically also contain other ingredients, such as, for example, rheological control agents such as castor oil and suspending agents, i.e., thickening agents, such as cellulose derivatives and ethoxylated amines. Again, the exact composition of the solder paste which can be cleaned by the cleaning composition of this invention is not particularly critical to the invention as it is has been found that the cleaner of this invention is effective for all types of solder pastes. It is also to be understood, that the cleaner of the present invention is effective for removal of solder pastes from any substrate such as the printing applicators which apply the solder paste to the PCBs and as well for remoal of solder pastes from PCBs prior to reflow.

The cleaning composition of the present invention includes alkalinity providing agents which are provided by one or more alkaline salts. Preferred salts are those of potassium and sodium and, especially preferred are the potassium and sodium carbonates and bicarbonates which are economical, safe and environmentally friendly. The carbonate salts include potassium carbonate, potassium carbonate dihydrate, potassium carbonate trihydrate, sodium carbonate, sodium carbonate decahydrate, sodium carbonate heptahydrate, sodium carbonate monohydrate, sodium sesquicarbonate and the double salts and mixtures thereof. The bicarbonate salts include potassium bicarbonate and sodium bicarbonate and mixtures thereof. The alkalinity providing agents are provided in the composition based on the total of active ingredients (without water) in amounts of between about 30 to 60 wt. %. Preferably, the alkaline salts are provided by the alkali metal carbonate salts described above. Alkali metal bicarbonate salts can be added in amounts of from about 0 to 10 wt. %. The alkaline salts are provided to maintain the aqueous solutions containing 0.5 to 30 wt. % of the active components at a pH of between 10 to 12, preferably, between 10.5 and 12 and, more preferably, between about 11 and 11.5.

Although not preferred, other suitable alkaline salts can be used including the alkali metal ortho and complex phosphates. Examples of alkali metal orthophosphates include trisodium or tripotassium orthophosphate. The complex phosphates are especially effective because of their ability to chelate water hardness and heavy metal ions. The complex phosphates include, for example, sodium or potassium pyrophosphate, tripolyphosphate and hexametaphosphates. It is preferred, however, to limit the amount of phosphates contained in the cleaners of this invention to less than 1 wt. % (phosphorus) relative to the total alkaline salt used inasmuch as the phosphates are ecologically undesirable being a major cause of eutrophication of surface water. Additional suitable alkaline salts for use in the cleaning composition of this invention include the alkali metal borates, silicates, acetates, citrates, tartrates, secsonates, edates, etc.

Surprisingly, it has been found that potassium salts of the above are most effective in preventing or removing the presence of a white residue which can remain as a film after cleaning using the cleaner of this invention. Accordingly, it is most preferably to provide all the alkaline salts present in the cleaner as potassium salts.

The cleaning composition of the present invention also includes at least one surfactant, preferably at least one nonionic surfactant to improve cleaning efficacy. More preferably, a plurality of surfactants are used and which are provided in a surfactant formulation which contains at least three nonionic surfactants having differing cloud points to be highly effective for cleaning over a broad temperature range. In general, the nonionic surfactants will have cloud points at least 5° F. different from each other. It is important to recognize that the cloud point of a surfactant as stated herein is the cloud point of the surfactant in an aqueous solution of the cleaning composition of the present invention. Thus, a listed cloud point for a surfactant in water may be slightly different than the cloud point of the same surfactant in the aqueous concentrate of the present invention since other components such as alkalinity providing agents and other active ingredients are present. The cloud point of the surfactant as defined herein is the particular temperature upon heating at which there is a sudden onset of turbidity within the aqueous solution as a result of surfactant separation.

More specifically, the nonionic surfactants which form the surfactant formulation of the present invention will have cloud points ranging from about 5° to about 25° F. from each other and, more preferably, from about a 10° to 20° F. difference from the cloud points of each other. Accordingly, the cleaning solution which contains the surfactant formulation is optimally effective over a wider temperature range than previous detergent compositions which were typically formulated with one or two surfactants chosen to be particularly effective at a particular temperature or very narrow temperature range. It is to be understood that additional nonionic surfactants can be included in the composition having a cloud point so as to further broaden the temperature range at which the composition is most effective. Similarly, other nonionic surfactants which have cloud points in between the cloud points of the three surfactants of the formulation can also be included although it is not believed that such surfactants particularly add to the efficacy of the cleaning composition of this invention and may simply provide undesirable additional organic materials which add to the biological oxygen demand (BOD) and chemical oxygen demand (COD) of the composition and aqueous solution formed therefrom.

The nonionic surfactants which can be utilized in accordance with the present invention include any nonionic surfactant which is available so long as the three surfactants utilized in the formulation have cloud points which are staggered by at least 5° F. from each other. In general, nonionic surfactants such as ethoxylated alcohols, ethylene oxide-propylene oxide block copolymers, ethoxylated-propoxylated alcohols, alcohol alkoxylate phosphate esters, ethoxylated amines and alkoxylated thioethers are believed to be useful surfactants in the surfactant formulation of the cleaning composition of the present invention.

More specific examples of nonionic surfactants include ethoxylated thiol surfactants as described for example in U.S. Pat. Nos. 4,575,569 and 4,931,205, the contents of both of which are herein incorporated by reference. A particularly useful commercial product is an ethoxylated dodecylmercaptan with about 6 ethylene oxide units which is a commercial product known as Alcodet 260™ marketed by Rhone-Poulenc.

Examples of other nonionic surfactants include compounds formed by condensing ethylene oxide with a hydrophobic base formed by the condensation of propylene oxide with propylene glycol. The hydrophobic portion of the molecule which exhibits water insolubility has a molecular weight from 1,500 to 1,800. The addition of polyoxyethylene radicals to this hydrophobic portion tends to increase the water solubility of the molecule as a whole in a liquid and the liquid character of the product is retained up to the point where the polyoxyethylene content is about 50% of the total weight of the condensation product. Examples of compositions are the "Pluronics" sold by BASF.

Other suitable surfactants include those derived from the condensation of ethylene oxide with the product resulting from the reaction of propylene oxide and ethylene-diamine or from the product of the reaction of a fatty acid with sugar, starch or cellulose. For example, compounds containing from about 40% to 80% polyoxyethylene by weight having a molecular weight from about 5,000 to 11,000 resulting from the reaction of ethylene oxide groups with a hydrophobic base constituted of the reaction product of ethylene diamine and excess propylene oxide, and hydrophobic basis having a molecular weight of the order of 25,000 to 3,000 are satisfactory.

In addition, the condensation product of aliphatic alcohols having from 8 to 18 carbon atoms, in either straight chain or branched chain configuration, with ethylene oxide and propylene oxide may also be employed. Examples of such surfactants are those of the "Plurafac" series, also sold by BASF.

Other useful surfactants include alkoxylated alcohols which are sold under the tradename of "Polytergent SL-Series" surfactants by Olin Corporation or "Neodol" by Shell Chemical Co.

Polyoxyethylene condensates of sorbitan fatty acids, alkanol amides, such as the monoalkanolamides, dialkanolamides, and amines; and alcohol alkoxylated phosphate esters, such as the "Klearfac" series from BASF are also useful surfactants in the compositions of this invention.

The polyethylene oxide/polypropylene oxide condensates of alkylphenols can also be used, but such surfactants are not effectively biodegradable and, in most cases, should be avoided.

Another useful surfactant are those derived from N-alkylpyrrolidone. Particularly useful is N-(n-alkyl)-2-pyrrolidone in which the alkyl group contains 6–15 carbon atoms. These compounds are described in U.S. Pat. No. 5,093,031 which is incorporated herein by reference.

Preferably, the cleaning composition of the present invention is useful at temperatures ranging from about 90°–150° F. more preferably, between 90° and under 145° F. and, most preferably, between 95° and 140° F. With respect to these preferred temperature ranges to remove the solder pastes from printing applicators or unreflowed circuit assemblies, the surfactant formulation will comprise a first surfactant having a cloud point which falls within the range of about 95°–120° F., a second surfactant having a cloud point which falls within the range of about 110°–135° F. and third surfactant having a cloud point which falls within the range of about 125°–150° F. The surfactants have cloud points which are staggered such that the second and third surfactants have a cloud point at least 5° F. higher than the cloud points of the first and second surfactant, respectively. Again, it is to be understood that the cloud points are those in the aqueous solution which is used or, in other words, in the diluted aqueous concentrate. It is not believed that the concentration of the composition in water has a large effect on cloud point.

To insure the solubility of the surfactants in aqueous solution, it is preferred to include a hydrotrope in the aqueous concentrate. The hydrotropes useful in this invention include the sodium, potassium, ammonium and alkanol ammonium salts of xylene, toluene, ethylbenzoate, isopropylbenzene, naphthalene, alkyl naphthalene sulfonates, phosphate esters of alkoxylated alkyl phenols, phosphate esters of alkoxylated alcohols and sodium, potassium and ammonium salts of the alkyl sarcosinates. The hydrotropes are useful in maintaining the organic materials including the surfactant readily dispersed in the aqueous cleaning solution and, in particular, in an aqueous concentrate which is an especially preferred form of packaging the compositions of the invention and allow the user of the compositions to accurately provide the desired amount of cleaning composition into the aqueous wash solution. A particularly preferred hydrotrope is one that does not foam. Among the most useful of such hydrotropes are those which comprise the alkali metal salts of intermediate chain length linear monocarboxylic fatty acids, i.e., $C_7$–$C_{13}$. Particularly preferred are the alkali metal octanoates and nonanoates.

Another adjuvant which can be added to the cleaning composition of the present invention includes anionic surfactants which are effective over a wide temperature range and do not cloud out as characterizes the nonionic surfactants. A particularly useful anionic surfactant is the polycarboxylated ethylene oxide condensates of fatty alcohols such as manufactured by Olin under the tradename of "Polytergent CS-1". A nonionic defoamer can also be added advantageously to the composition of the present invention. Typically, the defoamers are equivalent to the nonionic surfactants described above and include, for example, nonionic alkoxylated alcohols including fatty alcohols.

The cleaning compositions of the present invention will contain from about 3 to 15 wt. % of nonionic surfactants including any one or a mixture of surfactants such as provided by the preferred surfactant formulation as well as any nonionic defoaming agent which is provided. The hydrotrope such as the preferred alkali metal salts of $C_7$-$C_{13}$ monocarboxylic acids will be present in the composition at amounts ranging from between about 8 to 20 wt. %.

The cleaning compositions for the present invention contain one or more corrosion inhibitors to prevent corrosion of the printing applicators such as the metal screens and stencils. Among the most commonly used stencils for printing the solder paste onto PCBs is brass which can be very sensitive to alkaline solutions. Accordingly, the preferred corrosion inhibitor is an alkali metal silicate salt with the sodium and the potassium silicate salts being most preferred. The alkali metal silicates which are used can be in a variety of forms which can be expressed generally by the formula $M_2O:SiO_2$ wherein M represents the alkali metal and which the ratio of two oxides can vary. Most useful alkali metal silicates will have an $M_2O$ to $SiO_2$ mole ratio of between 1:0.5 to 1:4.5. Most preferably, the $M_2O$ to $SiO_2$ ratio is between 1:1.6 and 1:4.0. Such silicates also provide additional alkalinity to the wash water to help clean.

At low pH, i.e., below 13, and, in particular, below 12, it has been found that the silicate precipitates from aqueous solutions. Thus, the silicates need to be stabilized, in particular, in the aqueous concentrate form of the cleaning composition of this invention. The silicates are stabilized and kept in aqueous solution by the addition of an anionic polymer to the composition. Particularly preferred are anionic polymers containing carboxylate groups.

In general, anionic homopolymers or copolymers with molecular weights between about 1,000 to about 5 million or mixtures thereof are usefully employed in this invention as silicate stabilizers. However, the optimal polymers are ones which dissolve easily and do not increase the viscosity of the solutions to excessive levels when added at the concentration required for optimum silicate stability.

The following anionic polymers are noninclusive examples of those suitable for stabilizing silicates in aqueous alkaline solutions according to this invention: carboxymethyl cellulose, polyacrylic acid, polymethacrylic acid, polymaleic acid, polyglycolic acid, heteropolymers of acrylic and methacrylic acid, xanthan gum, carrageenan gum and alginate gum. In the alkaline solution of this invention, the anionic polymers are essentially present in the form of the sodium or potassium salts thereof. Additional alkali can be added to neutralize the polymer.

In a preferred embodiment, a high molecular weight polyacrylic acid such as in the form of sodium polyacrylate in solution is employed as the silicate stabilizing agent. The polyacrylate used in this embodiment should have a molecular weight of between about 100,000 and 4 million, preferably, 150,000 to 4 million. An especially preferred molecular weight range is about 250,000 to 2 million. Examples of such polymers are marketed under the tradename "Carbopol", from B.F. Goodrich.

The alkali metal silicate stabilizer is provided in amounts of from about 10 to 25 wt. % based on the total amount of active ingredients in the composition. The anionic polymer stabilizer is present in amounts of from about 3 to 8 wt. %. The stabilizer can be neutralized with caustic in amounts ranging from about 2 to 6 wt. % based on the amount of the active ingredients.

The cleaning compositions of the present invention are most preferably provided as aqueous concentrates. Preferably, the concentrates are dilute aqueous solutions containing 5–30 wt. % active ingredients and 70–95 wt. % water. More preferably, the aqueous concentrate of the present invention contains 10–20 wt. % active ingredients including alkalinity providing agents, surfactants, corrosion inhibitors, stabilizers, defoamers, etc. as described above and 80–90 wt. % water.

The alkalinity providing agents including the alkaline salts described above are preferably included in the aqueous concentrate in amounts ranging from 1–15 wt. %, more preferably, from about 5 to 10 wt. % based on the concentrate. Preferably, the alkaline salts are provided solely from alkali metal carbonate salts. If alkali metal bicarbonate salts are included, the amount added should not decrease the pH of the concentrate below 10.

Preferably, the amount of nonionic surfactants including the total amount of nonionic surfactants of the surfactant formulation, if used, will comprise at least about 0.2 wt. %, more preferably, from about 0.4 to 1.5 wt. % relative to the concentrate. Although, if a plurality of nonionic surfactants are used, each of the nonionic surfactants can be provided in equal amounts by weight, deviations from the use of equal amounts is well within the scope of the present invention.

The corrosion inhibitor is provided in amounts ranging from 0.5–5 wt. %, preferably from about 2 to 4 wt. % of the concentrate and the carboxylated polymeric stabilizer in amounts of 0.5–1.5 wt. %. The hydrotrope is preferably added in amounts ranging from 1.5–4.5%, the anionic surfactant in minute amounts typically ranging from 0.025–0.5 wt. % and the defoaming agent typically present in amounts ranging from about 0.4–1% by weight, all based on the weight of the aqueous concentrate.

The aqueous cleaning concentrate of the present invention is typically employed in the cleaning procedures described herein at a dilution rate in water of 10% by volume (10×). Obviously, smaller or higher dilution rates are also within the scope of the present invention and most likely will range from dilutions of 5× to 20× based on the dilution of the concentrate. Deionized water is preferably used to form the concentrate and for diluting the concentrate and washing the circuit assemblies. Generally, the aqueous wash solutions will contain at least 0.5 wt. % active ingredients with the preferred range of active components in the wash bath being between about 0.8 to 2 wt. %.

The cleaning composition of this invention can be used to clean any type of solder paste which has not been reflowed and from any particular substrate in which such solder paste has been applied and must be removed. In particular, the cleaner of the present invention is particularly useful in removing solder paste from applicators which are used to print the solder paste on PCBs. Typically, such printing applicators include metal screens and, more importantly, metal stencils. As described previously, it is important to maintain the surfaces and aperatures of the screens and stencils clean and free of accumulated solder paste to allow for the accurate printing of the PCBs and placement of SMT components having fine and ultra fine lead pitches without printing defects including opens and bridges. The cleaner of the present invention is also capable of removing misprinted solder paste from PCBs so long as the solder paste has not been reflowed.

For removal of the solder paste such as from screens and stencils, the compositions of the invention may be applied to such substrates by immersion in dip tanks, spray-in-air techniques, mechanical brushing or by hand. It is preferred that the cleaning of the substrates such as screens and stencils be accomplished by automated equipment including equipment which operates by immersion, spray-in-air and ultrasonics. By any of the techniques described above, the cleaning compositions or concentrates of the present invention are diluted with water for use. The cleaning solutions are to be used at temperatures ranging from about room temperature (75° F.) to 145° F. Preferably, the cleaning solutions are used at temperatures of from about 95° F. to 140° F. It is important that the cleaning compositions of this invention are useful at temperatures below 145° F. Above such temperature, the stencil apparatus can be harmed as adhesives used to hold the metal stencils in place in a framing device can soften, loosening the stencil and consequently reducing the ability of the stencil to be properly aligned for printing. Once the solder paste has been loosened and removed during the period of contact which typically ranges from about 1 to 5 minutes, the substrates such as the screens and stencils are taken from the cleaning solution. Herein, the stencils and screens may simply be flushed with water, deionized water is preferred, for a period of up to 2 minutes. The cleaned screens and stencils are then dried, preferably with forced air. Drying is expedited if the air is warmed, preferably to between about 80°–120° F.

EXAMPLE 1

The following example compared the effectiveness of several alkaline salt-containing compositions to remove rosin-based solder pastes containing 90 wt. % metal of 63/37 Sn/Pb relative to the effectiveness of a 75 vol. % aqueous solution of isopropyl alcohol. The sample compositions of the present invention which were compared are set forth in Table 1. Unless otherwise indicated, the surfactants comprised nonionic alkoxylated alcohols. The testing was accomplished by applying the wet solder pastes to pre-weighed brass screens which were again weighed with the loaded pastes. The screens were allowed to dry overnight (18 hours) and then washed at 130° F. The washed screens were then dried for one hour at 80° C. and then weighed. The percent of cleaning is provided by the following formula:

$$\frac{(\text{Initial grams paste} - \text{Final grams paste})}{\text{initial grams paste}} \times 100$$

Four runs for each cleaner were made. The results are shown in Table 2.

TABLE 1

| Ingredient | Sample 1 | Sample 2 | Sample 3 |
|---|---|---|---|
| Water | 75.49 | 82.85 | 82.85 |
| Sodium Hydroxide | 0.68 | 0.68 | 0.68 |
| Salts | | | |
| Potassium Carbonate | 7.81 | 3.9 | 3.9 |
| Sodium Carbonate Monohydrate | 6.90 | 3.45 | 3.45 |
| Suspending Agent | | | |
| B F Goodrich Carbopol 625 | 0.90 | 0.90 | 0.90 |
| Corrosion Inhibitor | | | |
| Potassium Silicate | 4.73 | 4.73 | 4.73 |
| Hydrotrope | | | |
| Sodium Isononanoate | 2.15 | 2.15 | 2.15 |
| Surfactants | | | |
| Olin Polytergent CS-1 (Anionic) | 0.05 | 0.05 | 0.05 |
| Olin Polytergent S405LF | 0.15 | 0.15 | |
| Olin Polytergent SL42 | 0.35 | 0.35 | |
| Olin Polytergent SLF18 (Defoamer) | 0.40 | 0.40 | |
| ISP Surfadone LP100 | 0.40 | 0.40 | |
| (Octyl Pyrrolidone) | | | |
| | | | Cloud Point |
| Olin Polytergent S505LF | | 0.15 | 105° F. |
| Olin Polytergent SL62 | | 0.25 | 135° F. |
| BASF Plurafac RA20 | | 0.15 | 120° F. |
| BASF Industrol DW5 (Defoamer) | | 0.50 | |

TABLE 2

| Sample | Run | Paste Removed Delta RA | Paste Removed Delta RMA | Paste Removed Delta RMA |
|---|---|---|---|---|
| 75% IPA | 1 | 9.40% | 4.76% | 2.91% |
| | 2 | 1.43% | 3.68% | 5.82% |
| | 3 | 2.34% | 2.39% | 3.53% |
| | 4 | 1.71% | 3.46% | 1.58% |
| | Avg | 3.72% | 3.57% | 3.46% |
| 1 | 1 | 11.17% | 8.33% | 30.15% |
| | 2 | 83.24% | 17.71% | 45.52% |
| | 3 | 93.52% | 18.78% | 32.04% |
| | 4 | 93.51% | 14.03% | 35.22% |
| | Avg | 70.36% | 14.71% | 35.73% |
| 2 | 1 | 65.19% | 11.19% | 25.89% |
| | 2 | 92.25% | 9.20% | 65.51% |
| | 3 | 76.98% | 32.49% | 60.59% |
| | 4 | 98.66% | 17.02% | 51.20% |
| | Avg | 83.27% | 17.48% | 50.80% |
| 3 | 1 | 71.38% | 27.50% | 80.86% |
| | 2 | 99.78% | 48.62% | 79.31% |
| | 3 | 97.88% | 58.23% | 85.56% |
| | 4 | 98.07% | 52.65% | 80.92% |
| | Avg | 91.78% | 46.75% | 81.66% |

As can be seen, the alkaline salt containing compositions of the present invention far out-performed the isopropyl alcohol which is now typically used for screen and stencil cleaning. Sample No. 3 which contained the surfactant formulation as described above in which the three surfactants are utilized having differing cloud points out-performed other alkaline salt cleaners.

EXAMPLE 2

Further comparative testing of the compositions of the present invention relative to removing solder pastes was compared versus the cleaning ability of isopropyl alcohol. Brass screens (15 mil pitch, 20×20 mesh) were cut into 1 in. by 2 in. coupons, precleaned and then weighed. Commercial solder pastes as exemplified in Table 4 were applied to 80% of the screen. The portion at the top of the screen was left solder free to allow for holding. Excess paste that was not within the holes of the screen was scraped off and the loaded screen was then weighed. The loaded screens were allowed to age 30 min. before washing. In a 250 ml beaker, 200 mls of the test solution were heated to the desired temperature and stirred at 500 rpm with a 1¼ in. diameter stir bar. Using a polypropylene hemostat, each loaded screen was then submersed in the outside of the vortex of the stirred solution, with the flat side of the screen facing into the vector of the solution movement. After five minutes in the test solution, the sample was removed and rinsed in cold deionized water for 30 sec. The cleaned screen was then hung in an oven at 80° C. for 1 hour, allowed to cool for 1 hour at room temperature and then weighed. The percent paste removed was then calculated as in Example 1.

The results of testing are shown in Table 4. The composition of the alkaline salt cleaner of the present invention (Sample 4) is shown in Table 3. The composition was in the form of a concentrate which was further diluted to yield a 10% concentrate in aqueous solution. The cleaning solutions were heated to 115° F. for cleaning. The isopropyl alcohol control was run at room temperature.

TABLE 3

| Ingredient | Sample 4 | |
| --- | --- | --- |
| Water | 84.22 | |
| Sodium Hydroxide | 0.63 | |
| Salts | | |
| Potassium Carbonate | 4.00 | |
| Sodium Carbonate Monohydrate | 3.50 | |
| Suspending Agent | | |
| B F Goodrich Carbopol 625 | 0.90 | |
| Corrosion Inhibitor | | |
| Potassium Silicate | 2.91 | |
| Hydrotrope | | |
| Sodium Isononanoate | 2.75 | |
| Surfactants | | |
| | | Cloud Point |
| Olin Polytergent CS-1 (Anionic) | 0.05 | |
| Olin Polytergent S505LF | 0.15 | 105° F. |
| Olin Polytergent SL62 | 0.25 | 135° F. |
| BASF Plurafac RA20 | 0.15 | 120° F. |
| BASF Industrol DW5 (Defoamer) | 0.50 | |
| pH | 11.30 | |

TABLE 4

| | | % paste removed | |
| --- | --- | --- | --- |
| Paste Name | Paste Type | Sample 4 | IPA |
| Kester NC-830 | No-clean | 67.55 | 17.78 |
| Delta 670 | No-clean | 90.47 | 61.53 |
| Heraeus SC3400HTP | No-clean | 99.43 | 58.50 |
| Heraeus SC3501M | Water Soluble | 99.95 | 77.21 |
| Heraeus F511 | Water Soluble | 99.96 | 85.41 |
| Heraeus F360 | No-Clean | 53.70 | 67.32 |
| Heraeus F363 | No-Clean | 99.93 | 63.00 |
| Heraeus F370 | No-Clean | 20.36 | 14.63 |
| Heraeus F380 | No-Clean | 78.91 | 78.70 |
| Kester RMA-810 | RMA | 80.28 | 58.22 |
| Delta 230 | RMA | 50.22 | 50.98 |
| Alpha RMA 390 | RMA | 99.96 | 25.09 |

The average paste removal values shown in Table 4 are the average of three replicate laboratory beaker tests for each paste. Table 4 shows that the composition of the present invention gave equal or significantly improved performance over isopropyl alcohol. Further, 100% paste removal was achieved for five of the pastes when using the composition of the present invention whereas the isopropyl alcohol never reached 100% removal in the tests. The level of performance of the compositions of this invention in the beaker test can be viewed as being very effective since there was considerably less mechanical action in the laboratory test than there would be in commercial equipment.

What is claimed is:

1. A method of cleaning solder paste from a substrate wherein said paste comprises unreflowed solder and a fluxing agent, said method comprising contacting the solder paste with an aqueous solution containing alkaline salts and a surfactant formulation containing at least one nonionic surfactant for a time sufficient to loosen the solder paste from the substrate.

2. The method of claim 1 wherein said alkaline salts comprise alkali metal carbonates.

3. The method of claim 2 wherein said alkali metal carbonates comprise potassium carbonate.

4. The method of claim 1 wherein said surfactant formulation contains at least three nonionic surfactants which have cloud points of at least 95° F. in the aqueous solution and the cloud points are at least 5° F. different from each other.

5. The method of claim 4 wherein the cloud points of each of said surfactants is 5°–25° F. different from each other.

6. The method of claim 4 wherein said three nonionic surfactants include a first surfactant having a cloud point in aqueous solution which falls within a range of 95°–120° F., a second surfactant having a cloud point in aqueous solution which falls within a range of 110°–135° F. and third surfactant having a cloud point in aqueous solution which falls within a range of 125°–150° F., said second and third surfactants having cloud points at least 10° F. higher than said first and second surfactants, respectively.

7. The method of claim 1 wherein said substrate is metal.

8. The method of claim 7 wherein said substrate is a printing applicator for applying solder paste to printed circuit boards.

9. The method of claim 8 wherein said printing applicator is a screen or a stencil.

10. The method of claim 9 wherein said printing applicator is a brass stencil.

11. The method of claim 4 wherein said substrate is a metal printing applicator for applying the solder paste to printed circuit boards.

12. The method of claim 11 wherein said metal printing applicator is a metal screen or stencil.

13. The method of claim 12 wherein said printing applicator is a brass stencil.

14. The method of claim 1 wherein said aqueous solution has a pH of between 10–12.

15. The method of claim 14 wherein said aqueous solution has a pH of between about 11–11.5.

16. The method of claim 1 wherein said aqueous solution further contains a hydrotrope to maintain said surfactant formulation in aqueous solution.

17. The method of claim 16 wherein said hydrotrope comprises an alkali metal salt of a linear moncarboxylic fatty acid having 7 to 13 carbon atoms.

18. The method of claim 1 wherein said aqueous solution further contains an alkali metal silicate corrosion inhibitor, said alkali metal silicate being characterized by formula $M_2O:SiO_2$ wherein M represents an alkali metal, said silicate having an $M_2O$ to $SiO_2$ mole ratio of between 1:1.6 and 1:4.5.

19. The method of claim 18 wherein said aqueous solution further contains a carboxylated polymer to stabilize said alkali metal silicate in aqueous solution.

20. The method of claim 19 wherein said carboxylated polymer comprises acrylic acid units and has a molecular weight of between about 100,000 and 4 million.

21. The method of claim 1 wherein said substrate comprises a printed circuit board.

22. The method of claim 1 wherein said aqueous solution is contacted with said substrate by immersing said substrate in a bath of said solution.

23. The method of claim 22 wherein said substrate is further subjected to ultrasonic vibration while contained within said bath.

24. The method of claim 1 wherein said aqueous solution is contacted with said substrate by spraying said substrate with said aqueous solution.

25. The method of claim 24 wherein said substrate is suspended in air during said spraying.

* * * * *